(12) United States Patent
Liu et al.

(10) Patent No.: US 12,464,917 B2
(45) Date of Patent: Nov. 4, 2025

(54) DISPLAY SUBSTRATE, MANUFACTURING METHOD THEREOF, AND DISPLAY DEVICE

(71) Applicants: HEFEI XINSHENG OPTOELECTRONICS TECHNOLOGY CO, LTD., Anhui (CN); BOE TECHNOLOGY GROUP CO., LTD., Beijing (CN)

(72) Inventors: Ning Liu, Beijing (CN); Can Yuan, Beijing (CN); Xinxin Wang, Beijing (CN); Yu Wang, Beijing (CN); Bin Zhou, Beijing (CN); Dacheng Zhang, Beijing (CN); Liangchen Yan, Beijing (CN)

(73) Assignees: Hefei Xinsheng Optoelectronics Technology Co., Ltd., Anhui (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/023,447

(22) PCT Filed: Mar. 16, 2022

(86) PCT No.: PCT/CN2022/081130
§ 371 (c)(1),
(2) Date: Feb. 27, 2023

(87) PCT Pub. No.: WO2023/173313
PCT Pub. Date: Sep. 21, 2023

(65) Prior Publication Data
US 2024/0276818 A1 Aug. 15, 2024

(51) Int. Cl.
*H10K 59/131* (2023.01)
*G09G 3/3208* (2016.01)
(Continued)

(52) U.S. Cl.
CPC ..... *H10K 59/1315* (2023.02); *H10K 59/1201* (2023.02); *H10K 59/122* (2023.02);
(Continued)

(58) Field of Classification Search
CPC ............. H10K 59/1315; H10K 59/122; H10K 59/1201; H10K 71/60; G09G 3/3208
See application file for complete search history.

(56) References Cited

U.S. PATENT DOCUMENTS 8,963,137 B2 *   2/2015  Lee ...................... H10K 59/122
                                                    439/151
11,557,636 B2 *  1/2023  Byun ................... H10K 50/844
(Continued)

FOREIGN PATENT DOCUMENTS

CN       109360900 A    2/2019
CN       110911461 A    3/2020
(Continued)

*Primary Examiner* — Mohsen Ahmadi
(74) *Attorney, Agent, or Firm* — The Webb Law Firm

(57) ABSTRACT

The present disclosure provides a display substrate, a manufacturing method thereof and a display device. The display substrate includes: a substrate structure including a base substrate; and a light-emitting structure, a pixel defining layer and a connection structure, wherein the light-emitting structure includes a conductive structure layer, a first light-emitting layer and a first electrode layer. The connection structure includes a first conductive layer, a second conductive layer and a top structure, wherein an orthographic projection of the second conductive layer on the base substrate is inside an orthographic projection of the top structure on the base substrate, and the top structure includes a second light-emitting layer, wherein an orthographic projection of the first light-emitting layer on the base substrate partially overlaps with an orthographic projection of the second light-emitting layer on the base substrate.

20 Claims, 4 Drawing Sheets

(51) Int. Cl.
  *H10K 59/12* (2023.01)
  *H10K 59/122* (2023.01)
  *H10K 71/16* (2023.01)
  *H10K 71/60* (2023.01)
  *H10K 102/00* (2023.01)

(52) U.S. Cl.
  CPC ............ *H10K 71/16* (2023.02); *H10K 71/60* (2023.02); *H10K 2102/3026* (2023.02)

(56) References Cited

U.S. PATENT DOCUMENTS

| | | | |
|---|---|---|---|
| 2005/0236629 A1 | 10/2005 | Lee et al. | |
| 2008/0158137 A1* | 7/2008 | Yoshida | G09G 3/3648 250/214 A |
| 2013/0056784 A1* | 3/2013 | Lee | H10K 59/1315 438/22 |
| 2014/0110674 A1* | 4/2014 | Choe | H10K 59/80522 257/89 |
| 2016/0071914 A1* | 3/2016 | Lee | H10K 50/824 438/46 |
| 2019/0074338 A1* | 3/2019 | Gu | H10K 50/828 |
| 2021/0066419 A1* | 3/2021 | Byun | H10K 71/00 |
| 2021/0175460 A1* | 6/2021 | Baek | H10K 50/824 |
| 2021/0359249 A1* | 11/2021 | Zhang | H10K 50/824 |
| 2021/0359274 A1* | 11/2021 | Kim | H10K 50/858 |
| 2021/0376283 A1 | 12/2021 | Shin et al. | |
| 2022/0075469 A1 | 3/2022 | Xia et al. | |
| 2022/0165980 A1* | 5/2022 | Shim | H10K 59/38 |
| 2022/0173179 A1* | 6/2022 | Lee | H10K 59/122 |
| 2022/0255038 A1 | 8/2022 | Wang et al. | |
| 2023/0180531 A1* | 6/2023 | Kim | H10K 50/16 |
| 2023/0413601 A1* | 12/2023 | Lee | H10K 59/8731 |
| 2024/0233611 A1* | 7/2024 | Sun | G09G 3/002 |

FOREIGN PATENT DOCUMENTS

| | | |
|---|---|---|
| CN | 112068732 A | 12/2020 |
| CN | 112952023 A | 6/2021 |
| CN | 112993183 A | 6/2021 |
| CN | 113013357 A | 6/2021 |
| CN | 113488514 A | 10/2021 |
| CN | 113725266 A | 11/2021 |
| JP | 2008135325 A | 6/2008 |

* cited by examiner

DISPLAY SUBSTRATE, MANUFACTURING METHOD THEREOF, AND DISPLAY DEVICE

CROSS-REFERENCE TO RELATED APPLICATION

This application is the United States National Phase of International Application No. PCT/CN2022/081130 filed Mar. 16, 2022, the disclosure of which is hereby incorporated by reference herein in its entirety.

BACKGROUND OF THE INVENTION

Field of the Invention

The present disclosure relates to a display substrate, a manufacturing method thereof, and a display device.

Description of Related Art

Since a top-gate type thin film transistor (TFT) has the characteristic of a short channel so that its ON-state current Ion is effectively enhanced, a display effect of a display device can be significantly improved and power consumption can be effectively reduced. Furthermore, since there is a small overlapping area between a gate and a source/drain of the top-gate type TFT so that a small parasitic capacitance is produced, there is also a relatively low possibility of poor problems such as short circuit of a gate line and a data line. With the above-described prominent advantages, the top-gate type TFT has attracted more and more public attention.

A top-emitting product is widely applied in a vehicle-mounted display such as an automobile or a metro, and a show case display such as a hotel or a clothing store, with prominent advantages such as high-definition image quality and high-fidelity display effect. In order to improve the transparency effect, a cathode will be made very thin for the top-emitting product with a large size, which results in that most of the display products is present with the problem of a voltage drop (IR drop) of the cathode. In the related art, the cathode may be effectively connected to an auxiliary cathode located on a backplane, thereby alleviating the IR drop problem.

SUMMARY OF THE INVENTION

According to an aspect of the present disclosure, a display substrate is provided. The display substrate comprises: a substrate structure comprising a base substrate; and a light-emitting structure, a pixel defining layer and a connection structure which are on a side of the base substrate, wherein at least a portion of the light-emitting structure is in an opening of the pixel defining layer, and the connection structure is on a side of the pixel defining layer away from the opening, wherein: the light-emitting structure comprises: a conductive structure layer on a side of the base substrate; a first light-emitting layer on a side of the conductive structure layer away from the base substrate; and a first electrode layer on a side of the first light-emitting layer away from the base substrate, wherein a portion of the first electrode layer and a portion of the first light-emitting layer are on a side surface of the pixel defining layer, the side surface of the pixel defining layer being between the opening and the connection structure and close to the connection structure, and the first electrode layer is electrically connected to the connection structure; and the connection structure comprises: a first conductive layer on a side of the base substrate; a second conductive layer on a side of the first conductive layer away from the base substrate; and a top structure on a side of the second conductive layer away from the base substrate, wherein an orthographic projection of the second conductive layer on the base substrate is inside an orthographic projection of the top structure on the base substrate, and the top structure comprises a second light-emitting layer; wherein an orthographic projection of the first light-emitting layer on the base substrate partially overlaps with an orthographic projection of the second light-emitting layer on the base substrate.

In some embodiments, the first light-emitting layer comprises an extension portion extending into a gap from the side surface of the pixel defining layer, the extension portion comprising a first extension portion and a second extension portion connected to the first extension portion, wherein the second extension portion is on a side of the first extension portion away from the pixel defining layer, wherein a distance between the second extension portion and the second conductive layer is less than a thickness of the first light-emitting layer along a direction perpendicular to the base substrate.

In some embodiments, the first extension portion has a first slope angle, the first slope angle being an angle between a first slope surface of the first extension portion and a bottom surface of the first extension portion; the second extension portion has a second slope angle, the second slope angle being an angle between a second slope surface of the second extension portion and a bottom surface of the second extension portion; wherein the first slope angle is different from the second slope angle.

In some embodiments, the first slope angle is greater than the second slope angle.

In some embodiments, the top structure further comprises: a third conductive layer between the second conductive layer and the second light-emitting layer; and a fourth conductive layer on a side of the second light-emitting layer away from the base substrate; wherein the second light-emitting layer has a third slope angle, the third slope angle being an angle between a side surface of the second light-emitting layer and a bottom surface of the second light-emitting layer.

In some embodiments, the first slope angle is less than the third slope angle.

In some embodiments, the second slope angle is less than the third slope angle.

In some embodiments, the second conductive layer has a fourth slope angle, the fourth slope angle being an angle between a side surface of the second conductive layer and a bottom surface of the second conductive layer.

In some embodiments, the fourth slope angle is less than the third slope angle.

In some embodiments, the first slope angle is less than the fourth slope angle, and the second slope angle is less than the fourth slope angle.

In some embodiments, the distance is greater than a length of a bottom surface of the first extension portion along a direction from the side surface of the pixel defining layer to the gap.

In some embodiments, the thickness of the first light-emitting layer is less than a length of a bottom surface of the second extension portion along a direction from the side surface of the pixel defining layer to the gap.

In some embodiments, an orthographic projection of the first extension portion on the base substrate does not overlap with the orthographic projection of the second light-emitting layer on the base substrate.

In some embodiments, an orthographic projection of the second extension portion on the base substrate is inside the orthographic projection of the top structure on the base substrate.

In some embodiments, the conductive structure layer comprises: a fifth conductive layer on a side of the base substrate, wherein the fifth conductive layer is in a same layer as the first conductive layer, the fifth conductive layer is isolated from the first conductive layer, and a material of the fifth conductive layer is the same as a material of the first conductive layer; a third electrode layer on a side of the fifth conductive layer away from the base substrate, wherein the third electrode layer is in a same layer as the second conductive layer, the third electrode layer is isolated from the second conductive layer, and a material of the third electrode layer is the same as a material of the second conductive layer; a sixth conductive layer on a side of the third electrode layer away from the base substrate, wherein the sixth conductive layer is in a same layer as the third conductive layer, the sixth conductive layer is isolated from the third conductive layer, and a material of the sixth conductive layer is the same as a material of the third conductive layer.

In some embodiments, the second light-emitting layer is in a same layer as the first light-emitting layer, and a material of the second light-emitting layer is the same as a material of the first light-emitting layer.

In some embodiments, the substrate structure further comprises: a second electrode layer on a side of the base substrate, wherein the second electrode layer is electrically connected to the first conductive layer; and a first insulating layer covering the second electrode layer, wherein the light-emitting structure, the pixel defining layer and the connection structure are on a side of the first insulating layer away from the base substrate.

In some embodiments, the substrate structure further comprises: a buffer layer between the base substrate and the second electrode layer; an active layer on a side of the buffer layer away from the base substrate; a second insulating layer on a side of the active layer away from the base substrate; a gate on a side of the second insulating layer away from the base substrate; an interlayer dielectric layer on the side of the buffer layer away from the base substrate, wherein the interlayer dielectric layer covers the active layer, the second insulating layer and the gate; and a fourth electrode layer and a fifth electrode layer which are on a side of the interlayer dielectric layer away from the base substrate, wherein the fourth electrode layer is electrically connected to the active layer through a first conductive via hole, the fifth electrode layer is electrically connected to the active layer through a second conductive via hole, the first conductive via hole and the second conductive via hole each passing through the interlayer dielectric layer, and the fourth electrode layer and the fifth electrode layer are in a same layer as the second electrode layer.

In some embodiments, the first insulating layer comprises: a passivation layer covering the second electrode layer, the fourth electrode layer and the fifth electrode layer, and a planarization layer on a side of the passivation layer away from the base substrate; the first conductive layer is electrically connected to the second electrode layer through a third conductive via hole, the third conductive via hole passing through the passivation layer and the planarization layer; and the conductive structure layer is electrically connected to the fourth electrode layer or the fifth electrode layer through a fourth conductive via hole, the fourth conductive via hole passing through the passivation layer and the planarization layer.

According to another aspect of the present disclosure, a display device is provided. The display device comprises the display substrate described previously.

According to another aspect of the present disclosure, a manufacturing method for a display substrate is provided. The manufacturing method comprises: providing a substrate structure, wherein the substrate structure comprises a base substrate; and forming a light-emitting structure, a pixel defining layer and a connection structure on a side of the base substrate, wherein at least a portion of the light-emitting structure is in an opening of the pixel defining layer, and the connection structure is on a side of the pixel defining layer away from the opening, wherein: the light-emitting structure comprises: a conductive structure layer on a side of the base substrate, a first light-emitting layer on a side of the conductive structure layer away from the base substrate, and a first electrode layer on a side of the first light-emitting layer away from the base substrate, wherein a portion of the first electrode layer and a portion of the first light-emitting layer are on a side surface of the pixel defining layer, the side surface of the pixel defining layer being between the opening and the connection structure and close to the connection structure, and the first electrode layer is electrically connected to the connection structure; and the connection structure comprises: a first conductive layer on a side of the base substrate, a second conductive layer on a side of the first conductive layer away from the base substrate, and a top structure on a side of the second conductive layer away from the base substrate, wherein an orthographic projection of the second conductive layer on the base substrate is inside an orthographic projection of the top structure on the base substrate, and the top structure comprises a second light-emitting layer, wherein an orthographic projection of the first light-emitting layer on the base substrate partially overlaps with an orthographic projection of the second light-emitting layer on the base substrate.

In some embodiments, the first light-emitting layer is formed by an evaporation process, and the first electrode layer is formed by a sputtering process.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings which constitute a part of this specification, illustrate the embodiments of the present disclosure, and together with this specification, serve to explain the principles of the present disclosure.

The present disclosure may be more explicitly understood from the following detailed description with reference to the accompanying drawings, in which.

Figure 1:
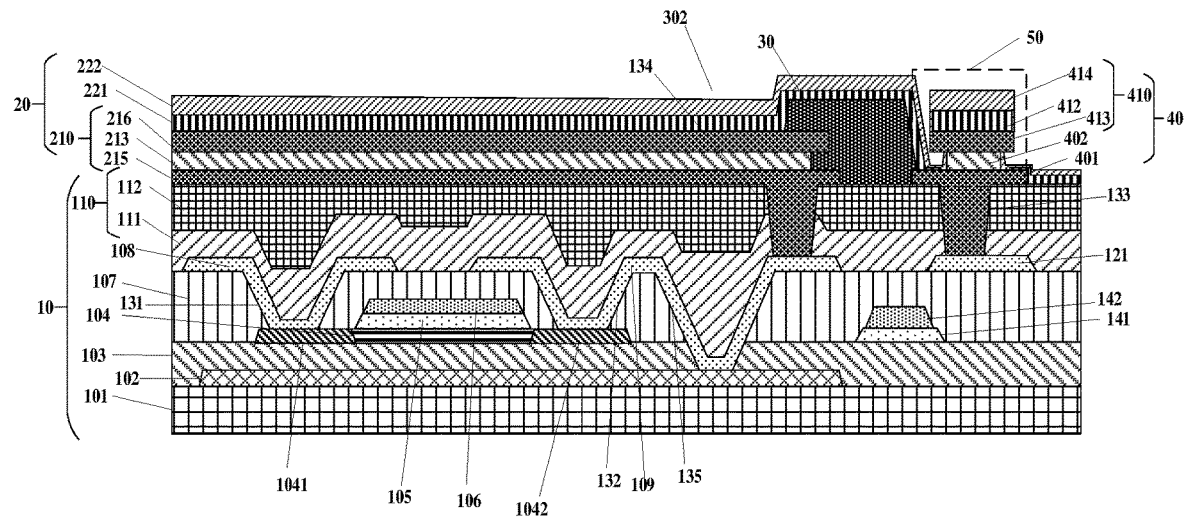
FIG. 1 is a schematic cross-sectional view showing a display substrate according to some embodiments of the present disclosure.

It should be understood that the dimensions of various parts shown in the accompanying drawings are not necessarily drawn according to actual proportional relations. In addition, the same or similar components are denoted by the same or similar reference signs.

DESCRIPTION OF THE INVENTION

Various exemplary embodiments of the present disclosure will now be described in detail in conjunction with the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include", or the like means that the element before the word covers the element (s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

A technical problem to be solved by the present disclosure is: to provide a display substrate, which may make it convenient to adequately connect a main cathode to an auxiliary cathode. The display substrate according to some embodiments of the present disclosure will be described in detail in conjunction with the accompanying drawings.

Figure 2:
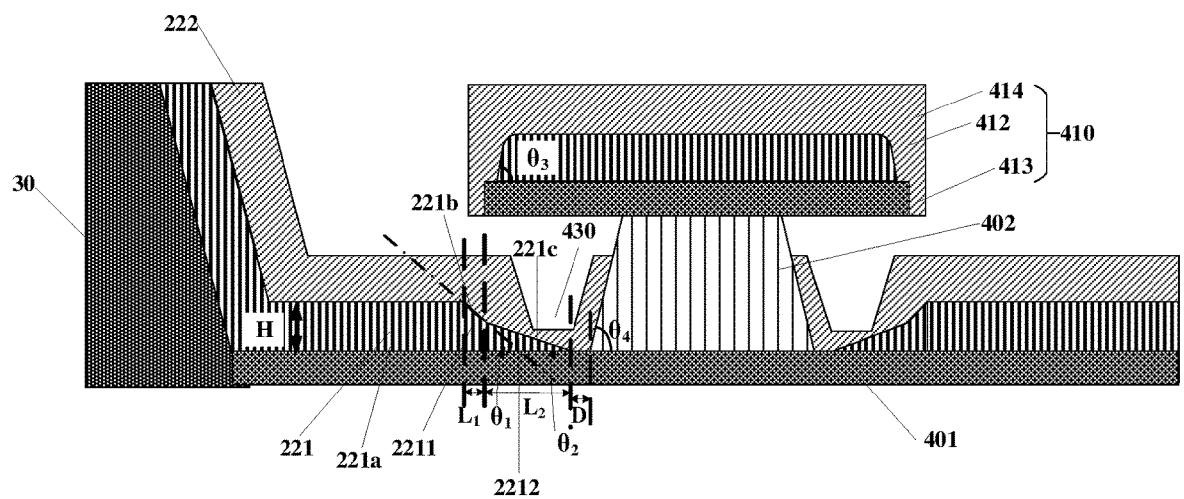
FIG. 2 is an enlarged schematic view showing a portion of a display substrate according to some embodiments of the present disclosure at block 50 in FIG. 1.

FIG. 1 is a schematic cross-sectional view showing a display substrate according to some embodiments of the present disclosure. FIG. 2 is an enlarged schematic view showing a portion of a display substrate according to some embodiments of the present disclosure at block 50 in FIG. 1. Hereinafter, the display substrate according to some embodiments of the present disclosure will be described in detail in conjunction with FIGS. 1 and 2.

As shown in FIG. 1, the display substrate comprises a substrate structure 10. The substrate structure 10 comprises a base substrate 101.

As shown in FIG. 1, the display substrate further comprises: a light-emitting structure 20, a pixel defining layer 30 and a connection structure 40 which are on a side of the base substrate 101. At least a portion of the light-emitting structure 20 is in an opening 302 of the pixel defining layer 30. The connection structure 40 is on a side of the pixel defining layer 30 away from the opening 302.

As shown in FIG. 1, the light-emitting structure 20 comprises: a conductive structure layer 210 on a side of the base substrate 101, a first light-emitting layer 221 on a side of the conductive structure layer 210 away from the base substrate 101, and a first electrode layer 222 on a side of the first light-emitting layer 221 away from the base substrate 101. For example, the first electrode layer 222 serves as a main cathode layer. For example, a material of the first electrode layer 222 comprises a conductive material such as Indium Zinc Oxide (IZO), etc. A portion of the first electrode layer 222 and a portion of the first light-emitting layer 221 are on a side surface of the pixel defining layer (i.e., a side surface on a side of the pixel defining layer away from the opening, also that is, an outer side surface of the pixel defining layer), the side surface of the pixel defining layer being between the opening 302 and the connection structure 40 and close to the connection structure. The first electrode layer 222 is electrically connected to the connection structure 40.

As shown in FIG. 1, the connection structure 40 comprises: a first conductive layer 401 on a side of the base substrate 101. For example, the first conductive layer 401 is electrically connected to the first electrode layer 222. For example, a material of the first conductive layer 401 comprises a transparent conductive material such as ITO (Indium Tin Oxide), etc. The connection structure 40 further comprises a second conductive layer 402 on a side of the first conductive layer 401 away from the base substrate 101. For example, a material of the second conductive layer 402 comprises a metal such as copper, silver, aluminum or aluminum alloy, etc. The connection structure 40 further comprises a top structure 410 on a side of the second conductive layer 402 away from the base substrate 101.

The top structure 410 comprises a second light-emitting layer 412. For example, a material of the second light-emitting layer comprises an organic light-emitting material. In some embodiments, as shown in FIG. 2, the second light-emitting layer 412 has a third slope angle $\theta_3$, the third slope angle $\theta_3$ being an angle between a side surface of the second light-emitting layer 412 and a bottom surface of the second light-emitting layer 412. For example, the angle is an acute angle. For example, the second light-emitting layer 412 is in a same layer as the first light-emitting layer 221, and the material of the second light-emitting layer is the same as a material of the first light-emitting layer. This facilitates a manufacture of the display substrate.

In some embodiments, as shown in FIGS. 1 and 2, the top structure 410 further comprises a third conductive layer 413 between the second conductive layer 402 and the second light-emitting layer 412. For example, a material of the third conductive layer 413 comprises a transparent conductive material such as ITO, etc. The second light-emitting layer 412 is on a side of the third conductive layer 413 away from the base substrate 101. As shown in FIGS. 1 and 2, the top structure 410 further comprises a fourth conductive layer 414 on a side of the second light-emitting layer 412 away from the base substrate 101. For example, a material of the fourth conductive layer 414 comprises a conductive material such as IZO, etc. For example, the fourth conductive layer 414 is in a same layer as the first electrode layer 222.

It should be noted that, "the same layer" refers to a layer structure formed by using the same film forming process to form a film layer for forming a specific pattern, and then using the same mask plate to pattern the film layer by a single patterning process. According to different specific patterns, the single patterning process may comprise multiple exposure, development or etching processes, and the specific patterns in the formed layer structure may be continuous or discontinuous. These specific patterns might also be at different heights or have different thicknesses.

As shown in FIGS. 1 and 2, an orthographic projection of the second conductive layer 402 on the base substrate 101 is inside an orthographic projection of the top structure 410 on the base substrate 101. The top structure 410 is spaced apart from the pixel defining layer 30 by a gap 430, and the second conductive layer 402 is spaced apart from the pixel defining layer 30 by the gap 430. An area of the orthographic projection of the second conductive layer 402 on the base substrate 101 is less than an area of the orthographic projection of the top structure 410 on the base substrate 101. The orthographic projection of the top structure 410 on the base substrate 101 completely covers the orthographic projection of the second conductive layer 402 on the base substrate 101. A transverse dimension of the second conductive layer 402 (i.e., a length of the second conductive layer along a direction from the side surface of the pixel defining layer 30 to the gap 430) is less than a transverse dimension of the top structure 410.

As shown in FIGS. 1 and 2, an orthographic projection of the first light-emitting layer 221 on the base substrate 101 partially overlaps with an orthographic projection of the second light-emitting layer 412 on the base substrate 101.

So far, a display substrate according to some embodiments of the present disclosure is provided. As described above, the display substrate comprises: a substrate structure comprising a base substrate; and a light-emitting structure, a pixel defining layer and a connection structure which are on a side of the base substrate, wherein at least a portion of the light-emitting structure is in an opening of the pixel defining layer, and the connection structure is on a side of the pixel defining layer away from the opening, wherein: the light-emitting structure comprises a conductive structure layer on a side of the base substrate; a first light-emitting layer on a side of the conductive structure layer away from the base substrate; and a first electrode layer on a side of the first light-emitting layer away from the base substrate; wherein a portion of the first electrode layer and a portion of the first light-emitting layer are on a side surface of the pixel defining layer, the side surface of the pixel defining layer being between the opening and the connection structure and close to the connection structure, and the first electrode layer is electrically connected to the connection structure; and the connection structure comprises: a first conductive layer on a side of the base substrate; a second conductive layer on a side of the first conductive layer away from the base substrate; and a top structure on a side of the second conductive layer away from the base substrate, wherein an orthographic projection of the second conductive layer on the base substrate is inside an orthographic projection of the top structure on the base substrate, and the top structure comprises a second light-emitting layer; wherein an orthographic projection of the first light-emitting layer on the base substrate partially overlaps with an orthographic projection of the second light-emitting layer on the base substrate. The above-described connection structure can conveniently cut off the light-emitting material at the gap, so that the first electrode layer is adequately electrically connected with the connection structure. In this way, the voltage drop problem can be adequately alleviated and the display uniformity of the display device can be improved.

In some embodiments, as shown in FIG. 1, the substrate structure 10 further comprises a second electrode layer 121 on a side of the base substrate 101. For example, the second electrode layer 121 serves as an auxiliary cathode layer. The second electrode layer 121 is electrically connected to the first conductive layer 401. The substrate structure 10 can further comprise a first insulating layer 110 covering the second electrode layer 121. The light-emitting structure 20, the pixel defining layer 30 and the connection structure 40 are on a side of the first insulating layer 110 away from the base substrate 101. For example, the first conductive layer 401 is electrically connected to the second electrode layer 121 through a conductive via hole passing through the first insulating layer 110. In the embodiment, a second electrode layer is provided such that the second electrode layer is electrically connected to the first conductive layer, so that the first electrode layer is adequately electrically connected to the second electrode layer. In this way, the voltage drop problem can be more adequately alleviated and the display uniformity of the display device can be improved.

In some embodiments, as shown in FIG. 2, the first light-emitting layer 221 comprises an extension portion extending from the side surface of the pixel defining layer 30 (i.e., the side surface of the pixel defining layer between the opening and the connection structure and close to the connection structure) into the gap 430. The extension portion comprises a first extension portion 2211 and a second extension portion 2212 connected to the first extension portion 2211, wherein the second extension portion 2212 is on a side of the first extension portion 2211 away from the pixel defining layer 30. A distance D between the second extension portion 2212 and the second conductive layer 402 is less than a thickness H of the first light-emitting layer 221 along a direction perpendicular to the base substrate. Here, the distance D is a distance between an end of the second extension portion 2212 close to the second conductive layer and an end of the second conductive layer 402 close to the second extension portion 2212. In the embodiment, since the first light-emitting layer has the extension portion, it is possible to enable the first electrode layer on the first light-emitting layer to extend to the first conductive layer and the second conductive layer along the extension portion, so that the fracture risk of the first electrode layer can be prevented as much as possible.

In some embodiments, as shown in FIG. 2, an orthographic projection of the first extension portion 2211 on the base substrate 101 does not overlap with the orthographic projection of the second light-emitting layer 412 on the base substrate 101.

In other embodiments, as shown in FIG. 2, an orthographic projection of the second extension portion 2212 on the base substrate 101 is inside the orthographic projection of the top structure 40 on the base substrate 101.

As shown in FIG. 2, the first extension portion 2211 has a first slope angle $\theta_1$, the first slope angle $\theta_1$ being an angle between a first slope surface 221b of the first extension portion 2211 and a bottom surface of the first extension portion (i.e., a bottom surface 221a of the extension portion). For example, the first slope angle $\theta_1$ is an acute angle. The second extension portion 2212 has a second slope angle $\theta_2$, the second slope angle $\theta_2$ being an angle between a second slope surface 221c of the second extension portion 2212 and a bottom surface of the second extension portion (i.e., the bottom surface 221a of the extension portion). For example, the second slope angle $\theta_2$ is an acute angle. The first slope angle $\theta_1$ is different from the second slope angle $\theta_2$. For example, the first slope angle $\theta_1$ is greater than the second slope angle $\theta_2$. This facilitates the first electrode layer to enter the gap smoothly so as to be electrically connected to the second conductive layer and the first conductive layer.

In addition, it has been previously described that the second light-emitting layer 412 has the third slope angle $\theta_3$, the third slope angle $\theta_3$ being an angle between the side surface of the second light-emitting layer 412 and the bottom surface of the second light-emitting layer 412. In some embodiments, the first slope angle $\theta_1$ is less than the third slope angle $\theta_3$. In other embodiments, the second slope angle $\theta_2$ is less than the third slope angle $\theta_3$.

As shown in FIG. 2, the fourth conductive layer 414 in the top structure can be connected to a sidewall of the third conductive layer 413 below along a sidewall of the second light-emitting layer 412. The third slope angle described above is more convenient to implement that the fourth conductive layer 414 is connected to the third conductive layer 413, so that it is possible to conveniently allow a large connecting area between the first electrode layer and the connection structure as much as possible, thereby better achieving the electrical connection effect between the first electrode layer and the second electrode layer (the auxiliary electrode).

As shown in FIG. 2, the second conductive layer 402 has a fourth slope angle $\theta_4$, the fourth slope angle $\theta_4$ being an angle between a side surface of the second conductive layer 402 and a bottom surface of the second conductive layer. For example, the fourth slope angle $\theta_4$ is an acute angle. In some embodiments, the fourth slope angle $\theta_4$ is less than the third slope angle $\theta_3$.

As shown in FIG. 2, the first electrode layer 222 diffuses to the sidewall of the second conductive layer 402 below the third conductive layer 413 along the surface of the first light-emitting layer 221, with a relatively large deposition thickness, while a portion of the first electrode layer 222 diffused onto the first conductive layer 401 is relatively thin. For example, in a case where a deposition thickness of the first electrode layer 222 is 3000 Å, a thickness of the portion of the first electrode layer 222 actually diffused onto the sidewall of the second conductive layer 402 is about 1000 Å, while a thickness of the portion of the first electrode layer 222 diffused onto the first conductive layer 401 is about 300 Å. This achieves the electrical connection between the first electrode layer and the second electrode layer, thereby reducing the voltage drop problem of the first electrode layer.

In addition, the portion of the first electrode layer 222 diffused onto the sidewall of the second conductive layer 402 may cover the entire sidewall of the second conductive layer 402, and may even have a certain supporting effect on the third conductive layer 413 of the top structure. This may ensure a large connecting area between the first electrode layer and the first conductive layer/second conductive layer as much as possible, so as to better achieve the electrical connection effect between the first electrode layer and the second electrode layer (the auxiliary electrode), and has a certain supporting effect on the third conductive layer above, which may prevent the fracture of a portion of the third conductive layer beyond the second conductive layer.

In some embodiments, the first slope angle $\theta_1$ is less than the fourth slope angle $\theta_4$, and the second slope angle $\theta_2$ is less than the fourth slope angle $\theta_4$. That is, both the first slope angle and the second slope angle are relatively smooth, so that the first electrode layer on the first light-emitting layer can smoothly extend to the first conductive layer and the second conductive layer, thereby preventing the fracture risk of the first electrode layer as much as possible.

In some embodiments, the distance D is greater than a length $L_1$ of a bottom surface of the first extension portion 2211 along a direction from the side surface of the pixel defining layer 30 to the gap 430. In this way, the first electrode layer can be adequately electrically connected to the first conductive layer as much as possible, and further adequately electrically connected to the second electrode layer.

In some embodiments, the thickness H of the first light-emitting layer 221 is less than a length $L_2$ of a bottom surface of the second extension portion 2212 along a direction from the side surface of the pixel defining layer 30 to the gap 430. In this way, the second extension portion of the first light-emitting layer extends relatively smoothly and obliquely, so that the first electrode layer on the first light-emitting layer can smoothly extend to the first conductive layer and the second conductive layer, thereby preventing the fracture risk of the first electrode layer as much as possible.

In the embodiment of the present disclosure, under the conditions of the same length (for example, about 0.80 micron) of the portion of the top structure 410 beyond the second conductive layer 402 and the same thickness (for example, 6000 Å) of the second conductive layer 402 in different display substrates, when different thicknesses of the first electrode layer 222 are used (for example, when the thickness of the first electrode layer is 1000 Å or 3000 Å), it may be found that the thickness of the portion of the first electrode layer diffusing into the portion below the top structure 410 does not differ greatly, and the thickness of the portion of the first electrode layer on the sidewall of the second conductive layer does not differ greatly as well.

In some embodiments, as shown in FIG. 1, the conductive structure layer 210 comprises: a fifth conductive layer 215 on a side of the base substrate 101 (for example, on a side of the first insulating layer 110 away from the base substrate 101, as shown in FIG. 1). The fifth conductive layer 215 is in a same layer as the first conductive layer 401, and the fifth conductive layer is isolated from the first conductive layer. For example, the fifth conductive layer 215 and the first conductive layer 401 are both on the first insulating layer 110. For example, a material of the fifth conductive layer 215 is the same as a material of the first conductive layer 401. For example, the material of the fifth conductive layer 215 comprises a transparent conductive material such as ITO, etc.

As shown in FIG. 1, the conductive structure layer 210 further comprises: a third electrode layer 213 on a side of the fifth conductive layer 215 away from the base substrate 101. The third electrode layer 213 is in a same layer as the second conductive layer 402, and the third electrode layer is isolated from the second conductive layer. For example, a material of the third electrode layer 213 is the same as a material of the second conductive layer 402. For example, the material of the third electrode layer 213 comprises a metal such as copper, silver, aluminum or aluminum alloy, etc. The third electrode layer may serve as a reflective anode layer.

As shown in FIG. 1, the conductive structure layer 210 further comprises: a sixth conductive layer 216 on a side of the third electrode layer 213 away from the base substrate 101. The sixth conductive layer 216 is in a same layer as the third conductive layer 413, and the sixth conductive layer is isolated from the third conductive layer. For example, a material of the sixth conductive layer 216 is the same as a material of the third conductive layer 413. For example, the material of the sixth conductive layer 216 comprises a transparent conductive material such as ITO, etc.

The structure of the substrate structure 10 will be described in detail in conjunction with FIG. 1.

In some embodiments, as shown in FIG. 1, the substrate structure 10 further comprises: a buffer layer 103 between the base substrate 101 and the second electrode layer 121, and an active layer 104 on a side of the buffer layer 103 away from the base substrate 101. For example, a material of the buffer layer 103 comprises an insulating material such as silicon oxide, silicon nitride or silicon oxynitride, etc. For example, a material of the active layer 104 comprises a semiconductor material (for example, silicon, or the like). The active layer 104 may comprise a first conductive portion 1041 located at one end of the active layer and a second conductive portion 1042 located at the other end of the active layer. The first conductive portion 1041 and the second conductive portion 1042 facilitate the electrical connection with other electrode layers, thereby reducing the contact resistance.

In some embodiments, as shown in FIG. 1, the substrate structure 10 further comprises: a light shielding layer 102 between the base substrate 101 and the buffer layer 103. For example, a material of the light shielding layer comprises a metal such as aluminum or molybdenum, etc.

In some embodiments, as shown in FIG. 1, the substrate structure 10 further comprises: a second insulating layer 105 on a side of the active layer 104 away from the base substrate 101. The second insulating layer 105 serves as a gate insulating layer. For example, the second insulating layer 105 comprises an insulating material such as silicon dioxide and/or silicon nitride, etc. As shown in FIG. 1, the substrate structure 10 further comprises: a gate 106 on a side of the second insulating layer 105 away from the base substrate 101. The substrate structure 10 further comprises: an interlayer dielectric layer 107 on a side of the buffer layer 103 away from the base substrate 101. The interlayer dielectric layer 107 covers the active layer 104, the second insulating layer 105 and the gate 106. For example, a material of the interlayer dielectric layer 107 comprises silicon dioxide and/or silicon nitride, etc.

In some embodiments, as shown in FIG. 1, the substrate structure 10 further comprises a fourth electrode layer 108 and a fifth electrode layer 109 which are on a side of the interlayer dielectric layer 107 away from the base substrate 101. The fourth electrode layer 108 is electrically connected to the active layer 104 (for example, the first conductive portion 1041 of the active layer 104) through a first conductive via hole 131, and the fifth electrode layer 109 is electrically connected to the active layer 104 (for example, the second conductive portion 1042 of the active layer 104) through a second conductive via hole 132. The first conductive via hole 131 and the second conductive via hole 132 each pass through the interlayer dielectric layer 107. The fourth electrode layer 108 and the fifth electrode layer 109 are in a same layer as the second electrode layer 121. For example, the fourth electrode layer 108, the fifth electrode layer 109 and the second electrode layer 121 are all located on the interlayer dielectric layer 107. The fifth electrode layer 109 may further be electrically connected to the light shielding layer 102 through a fifth conductive via hole 135. The fifth conductive via hole passes through the interlayer dielectric layer 107 and the buffer layer 103.

In some embodiments, as shown in FIG. 1, the first insulating layer 110 comprises: a passivation layer 111 covering the second electrode layer 121, the fourth electrode layer 108 and the fifth electrode layer 109, and a planarization layer 112 on a side of the passivation layer 111 away from the base substrate 101. For example, the passivation layer comprises an inorganic insulating material such as silicon dioxide or the like, and the planarization layer comprises an organic insulating material (for example, polyimide or the like).

In some embodiments, as shown in FIG. 1, the first conductive layer 401 is electrically connected to the second electrode layer 121 through a third conductive via hole 133, the third conductive via hole 133 passing through the passivation layer 111 and the planarization layer 112.

In some embodiments, as shown in FIG. 1, the conductive structure layer 210 is electrically connected to the fourth electrode layer 108 or the fifth electrode layer 109 through a fourth conductive via hole 134. For example, FIG. 1 shows that the fifth conductive layer 215 of the conductive structure layer 210 is electrically connected to the fifth electrode layer 109 through the fourth conductive via hole 134. The fourth conductive via hole 134 passes through the passivation layer 111 and the planarization layer 112.

In some embodiments, as shown in FIG. 1, the substrate structure 10 further comprises a third insulating layer 141 on a side of the buffer layer 103 away from the base substrate 101 and a gate line 142 on a side of the third insulating layer 141 away from the base substrate 101. For example, the third insulating layer 141 is in a same layer as the second insulating layer 105, and a material of the third insulating layer 141 is the same as a material of the second insulating layer 105. This facilitates the manufacture of the display substrate. For example, the gate line 142 is in a same layer as the gate 106, and a material of the gate line 142 is the same as a material of the gate 106. This also facilitates the manufacture of the display substrate.

So far, the structure of the substrate structure 10 of the display substrate has been described in detail.

According to some embodiments of the present disclosure, a display device is also provided, wherein the display device comprises the display substrate as described previously. For example, the display device may be: any product or member having a display function such as a display panel, a mobile phone, a tablet computer, a television, a display, a notebook computer, a digital photo frame, a navigator, or the like.

Figure 3:
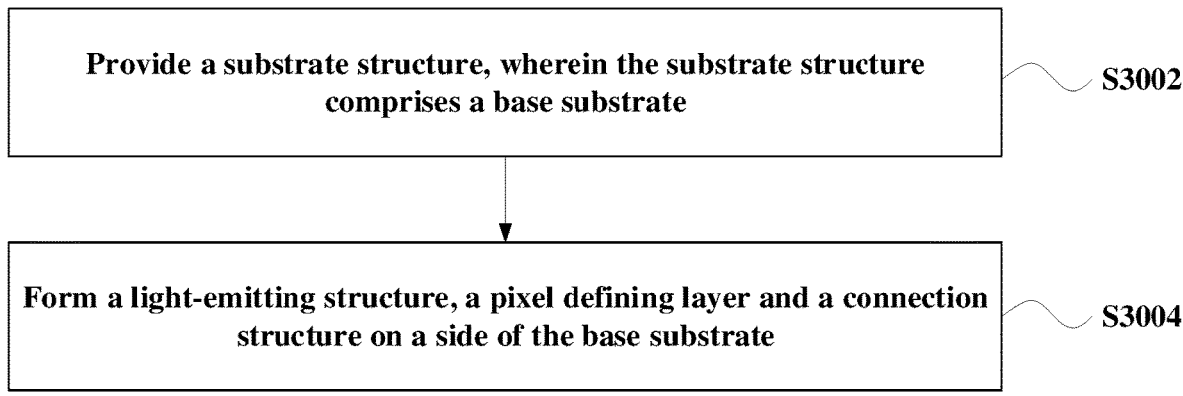
FIG. 3 is a flowchart showing a manufacturing method for a display substrate according to some embodiments of the present disclosure.

FIG. 3 is a flowchart showing a manufacturing method for a display substrate according to some embodiments of the present disclosure. FIGS. 4 to 9 are schematic cross-sectional views showing structures at several stages during a manufacturing process of a display substrate according to some embodiments of the present disclosure. The manufacturing process of the display substrate according to some embodiments of the present disclosure will be described in detail in conjunction with FIGS. 3, 4 to 9 and FIG. 1. As shown in FIG. 3, the manufacturing method for the display substrate comprises steps S3002 to S3004.

As shown in FIG. 3, at step S3002, a substrate structure is provided, wherein the substrate structure comprises a base substrate.

The process of providing the substrate structure will be described in detail in conjunction with FIGS. 4 to 6.

Figure 4:
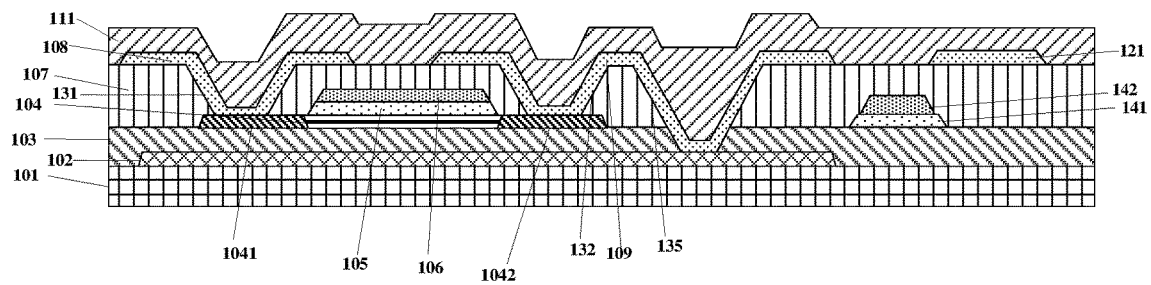
FIG. 4 is a schematic cross-sectional view showing a structure at a stage during a manufacturing process of a display substrate according to some embodiments of the present disclosure.

First, as shown in FIG. 4, optionally, a patterned light shielding layer 102 is formed on the base substrate 101.

Next, as shown in FIG. 4, for example, a buffer layer 103 is formed on the base substrate by a deposition process, wherein the buffer layer 103 covers the light shielding layer 102.

Next, as shown in FIG. 4, a patterned active layer 104 is formed on a side of the buffer layer 103 away from the base substrate 101.

Next, as shown in FIG. 4, a patterned second insulating layer 105 on a side of the active layer 104 away from the base substrate, a third insulating layer 141 on a side of the buffer layer 103 away from the base substrate, a patterned gate 106 on a side of the second insulating layer 105 away from the base substrate and a patterned gate line 142 on a side of the third insulating layer 141 away from the base substrate are formed.

For example, the forming of the second insulating layer 105, the third insulating layer 141, the gate 106 and the gate line 142 comprises: for example, forming an insulating layer covering the active layer 104 and the buffer layer 103 by a deposition process, then forming a first metal layer on the insulating layer by a deposition process, and then patterning the insulating layer and the first metal layer to form the second insulating layer 105, the third insulating layer 141, the gate 106 and the gate line 142.

Next, after the gate is formed by patterning, both ends of the active layer may be subjected to a conducting treatment by a mask layer (for example, photoresist not shown) on the gate 106 using a self-alignment conducting process to form a first conductive portion 1041 and a second conductive portion 1042. In this way, a channel area and a conductive area of the active layer can be formed. For example, the active layer is subjected to a bombardment process by a plasma (for example, He (helium) plasma) so that conducting is achieved. Here, the conductive area is the first conductive portion and the second conductive portion, and the channel area is an area of the active layer between the first conductive portion and the second conductive portion. Then, the mask layer is removed.

Next, as shown in FIG. 4, an interlayer dielectric layer 107 is formed on a side of the buffer layer 103 away from the base substrate 101 by a deposition process, wherein the interlayer dielectric layer 107 covers the active layer 104, the second insulating layer 105, the gate 106, the third insulating layer 141 and the gate line 142. Then, the interlayer dielectric layer 107 and the buffer layer 103 are etched to form a first conductive via hole 131, a second conductive via hole 132 and a fifth conductive via hole 135. The first conductive via hole 131 exposes the first conductive portion 1041 of the active layer 104, the second conductive via hole 132 exposes the second conductive portion 1042 of the active layer 104, and the fifth conductive via hole 135 exposes a part of the light shielding layer 102.

Next, as shown in FIG. 4, a fourth electrode layer 108, a fifth electrode layer 109 and a second electrode layer 121 in a same layer are formed on the interlayer dielectric layer 107 by a deposition process and a patterning process. The fourth electrode layer 108 is electrically connected to the first conductive portion 1041 of the active layer 104 through the first conductive via hole 131, the fifth electrode layer 109 is electrically connected to the second conductive portion 1042 of the active layer 104 through the second conductive via hole 132, and the fifth electrode layer 109 is further electrically connected to the part of the light shielding layer 102 through the fifth conductive via hole 135. In addition, optionally, a power supply voltage line, a sensing line (not shown) and the like may also be formed whilst forming the fourth electrode layer 108, the fifth electrode layer 109 and the second electrode layer 121.

Next, as shown in FIG. 4, a passivation layer 111 covering the second electrode layer 121, the fourth electrode layer 108 and the fifth electrode layer 109 is formed on the interlayer dielectric layer 107 by a deposition process.

Figure 5:
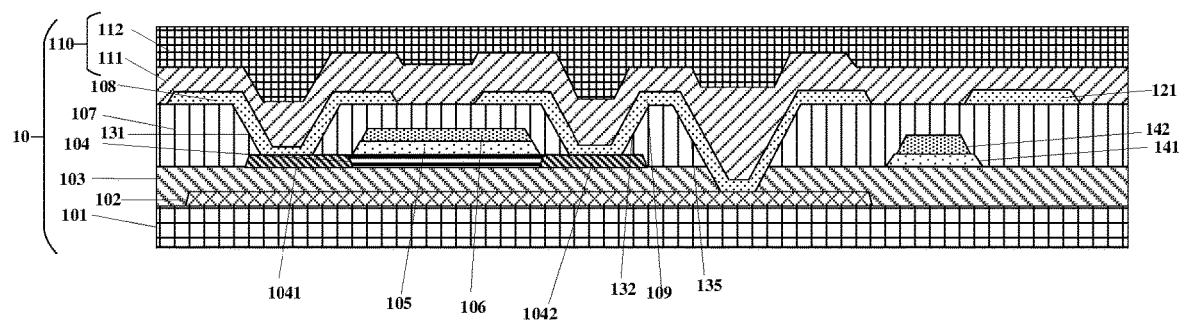
FIG. 5 is a schematic cross-sectional view showing a structure at another stage during a manufacturing process of a display substrate according to some embodiments of the present disclosure.

Next, as shown in FIG. 5, a planarization layer 112 is formed on a side of the passivation layer 111 away from the base substrate 101. So far, a first insulating layer 110 is formed, wherein the first insulating layer 110 comprises the passivation layer 111 and the planarization layer 112.

Figure 6:
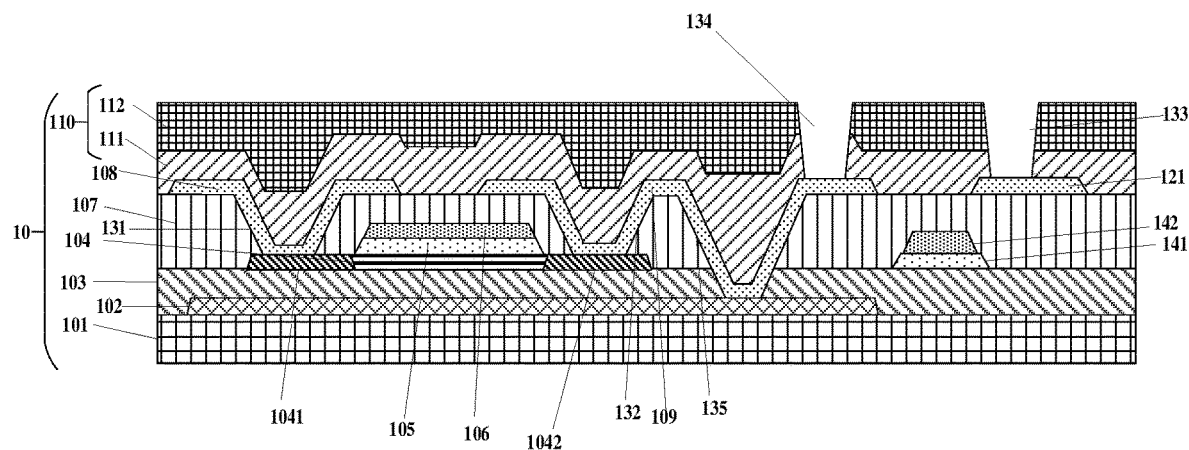
FIG. 6 is a schematic cross-sectional view showing a structure at another stage during a manufacturing process of a display substrate according to some embodiments of the present disclosure.

Next, as shown in FIG. 6, via holes 133 and 134 passing through the planarization layer 112 and the passivation layer 111 are formed by an etching process. The via hole 133 serves as a third conductive via hole, and the via hole 134 serves as a fourth conductive via hole. The via hole 133 exposes a part of the second electrode layer 121, and the via hole 134 exposes a part of the fifth electrode layer 109.

So far, the substrate structure 10 has been formed.

Returning to FIG. 3, at step S3004, a light-emitting structure, a pixel defining layer and a connection structure are formed on a side of the base substrate.

The process of forming the light-emitting structure, the pixel defining layer and the connection structure will be described in detail in conjunction with FIGS. 7 to 9 and FIG. 1.

Figure 7:
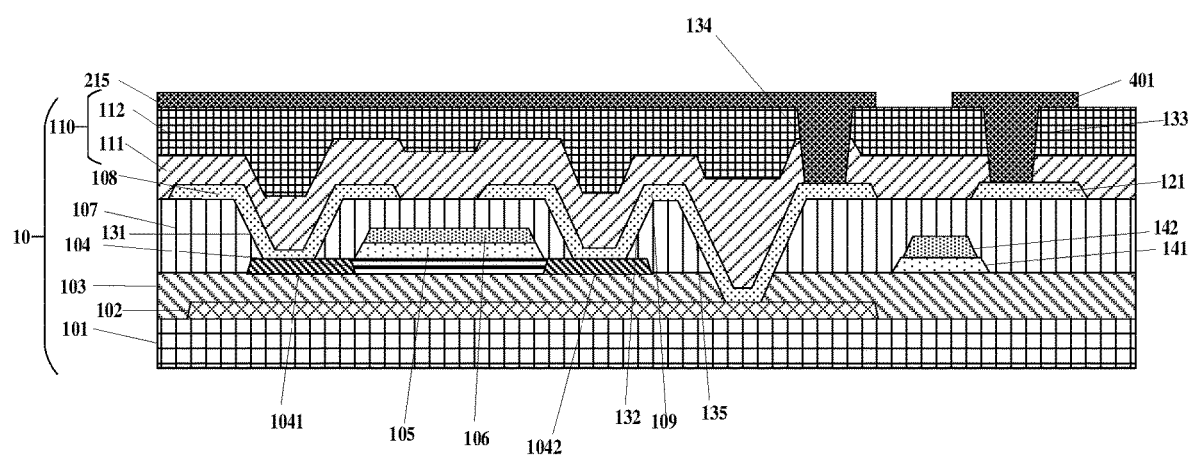
FIG. 7 is a schematic cross-sectional view showing a structure at another stage during a manufacturing process of a display substrate according to some embodiments of the present disclosure.

As shown in FIG. 7, a fifth conductive layer 215 and a first conductive layer 401 are formed on the planarization layer 112 by a deposition process and a patterning process. For example, a first transparent conductive layer is formed by a deposition process and then the first transparent conductive layer is patterned to form the fifth conductive layer 215 and the first conductive layer 401.

Figure 8:
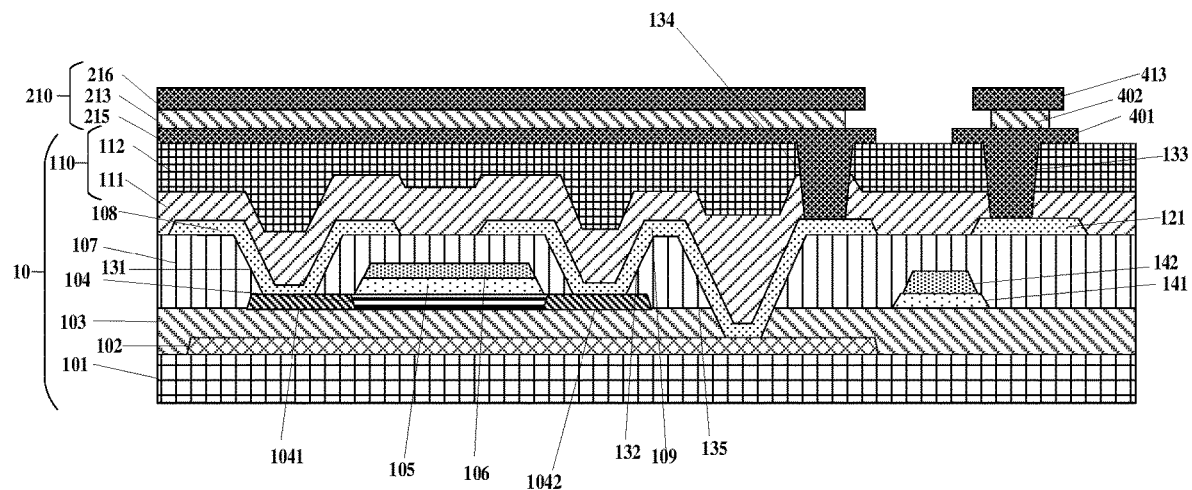
FIG. 8 is a schematic cross-sectional view showing a structure at another stage during a manufacturing process of a display substrate according to some embodiments of the present disclosure.

Next, as shown in FIG. 8, a second metal layer covering the fifth conductive layer 215 and the first conductive layer 401 is formed by a deposition process, and a second transparent conductive layer is formed on the second metal layer by a deposition process, and then the second metal layer and the second transparent conductive layer are patterned to form a third electrode layer 213, a second conductive layer 402, a sixth conductive layer 216 and a third conductive layer 413. Here, the third electrode layer 213 and the second conductive layer 402 are formed during the process of patterning the second metal layer, and the sixth conductive layer 216 and the third conductive layer 413 are formed during the process of patterning the second transparent conductive layer.

Next, as shown in FIG. 8, for example, the sixth conductive layer 216 and the third conductive layer 413 located in the top layer are etched with $H_2SO_4$ series dilute acid. For example, components of $H_2SO_4$ series dilute acid comprise: $H_2SO_4$ (5%-14%), $HNO_3$ (2%-9%), $CH_3COOH$ (2%-9%) and other trace additives, etc. Then, for example, the third electrode layer 213 and the second conductive layer 402 are subjected to excessive etching by using $H_3PO_4$ concentrated acid, so that the third electrode layer 213 and the second conductive layer 402 have a large amount of indentation, thereby making the sixth conductive layer 216 and the third conductive layer 413 protrude outward with a long tip (Tip). For example, components of $H_3PO_4$ series concentrated acid comprise: $H_3PO_4$ (63%-72%), $HNO_3$ (2.5%), $CH_3COOH$ (4%-13%) and other trace additives, etc.

In the above steps, the conductive structure layer 210 is formed.

Figure 9:
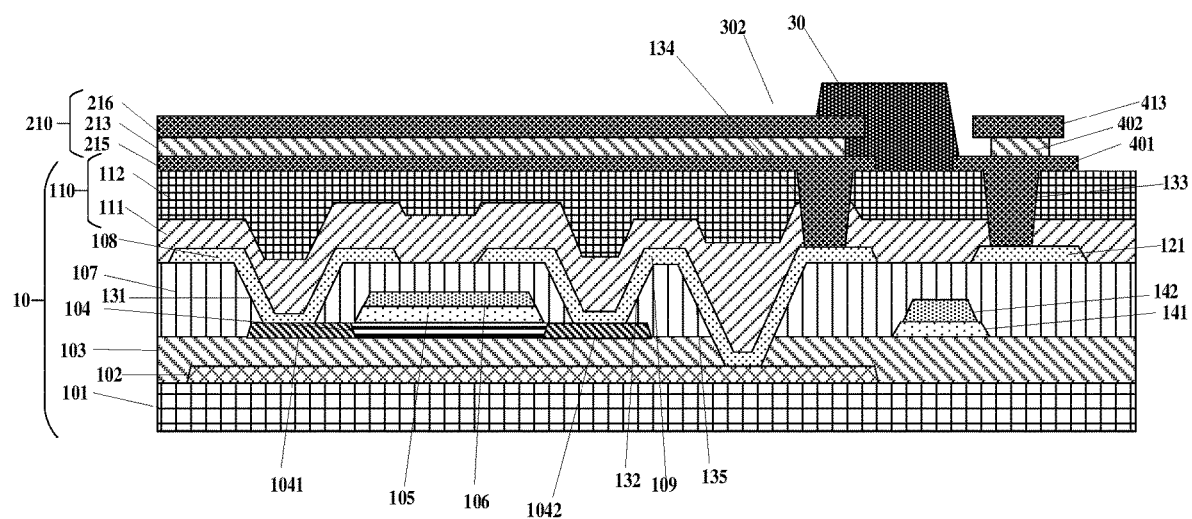
FIG. 9 is a schematic cross-sectional view showing a structure at another stage during a manufacturing process of a display substrate according to some embodiments of the present disclosure.

Next, as shown in FIG. 9, a pixel defining layer 30 is formed by a deposition process and a patterning process, wherein the pixel defining layer 30 has an opening 302.

Next, as shown in FIG. 1, a first light-emitting layer 221 is formed by an evaporation process, and during the evaporation process, a second light-emitting layer 412 is also formed. Since the light-emitting layer formed by the evaporation process has a relatively poor diffusion performance, the tip of the third conductive layer 413 may cut off the light-emitting layer and prevent the material of the light-emitting layer from deposition to enter below the tip as much as possible.

Next, as shown in FIG. 1, a first electrode layer 222 is formed by a sputtering process, and during the sputtering process, a fourth conductive layer 414 is also formed. Since the conductive layer formed by the sputtering process has a favorable diffusion performance, it is possible to bypass the above-mentioned tip so as to be deposited on the surfaces of the first conductive layer 401 and the second conductive layer 402 below the tip, thereby achieving adequate electrical connection between the first electrode layer 222 and the second electrode layer 121. Here, a top structure 410 is formed, wherein the top structure 410 comprises the third conductive layer 413, the second light-emitting layer 412 and the fourth conductive layer 414.

So far, the light-emitting structure, the pixel defining layer and the connection structure are formed. At least a portion of the light-emitting structure is in the opening of the pixel defining layer, and the connection structure is on a side of the pixel defining layer away from the opening, wherein: the light-emitting structure comprises: a conductive structure layer on a side of the base substrate, a first light-emitting layer on a side of the conductive structure layer away from the base substrate, and a first electrode layer on a side of the first light-emitting layer away from the base substrate, wherein a portion of the first electrode layer and a portion of the first light-emitting layer are on a side surface of the pixel defining layer, the side surface of the pixel defining layer being between the opening and the connection structure and close to the connection structure, and the first electrode layer is electrically connected to the connection structure; and the connection structure comprises: a first conductive layer on a side of the base substrate, a second conductive layer on a side of the first conductive layer away from the base substrate, and a top structure on a side of the second conductive layer away from the base substrate, wherein an orthographic projection of the second conductive layer on the base substrate is inside an orthographic projection of the top structure on the base substrate, and the top structure comprises a second light-emitting layer, wherein an orthographic projection of the first light-emitting layer on the base substrate partially overlaps with an orthographic projection of the second light-emitting layer on the base substrate.

So far, a manufacturing method for a display substrate according to some embodiments of the present disclosure is provided. In the manufacturing method, the connection structure may cut off the light-emitting material at the gap conveniently, so that the first electrode layer is adequately electrically connected to the connection structure (for example, the first conductive layer). In this way, the voltage drop problem of the first electrode layer can be adequately alleviated and the display uniformity of the display device can be improved.

Further, the first electrode layer is electrically connected to the connection structure, and then adequately connected to the second electrode layer, so that the voltage drop problem of the first electrode layer can be more adequately alleviated and the display uniformity of the display device can be improved.

In the above-described manufacturing method, the second electrode layer can be arranged in the same layer as the fourth electrode layer/fifth electrode layer so that the process steps are lessened; and the second electrode layer is formed below the light-emitting layer without affecting the efficiency of the light-emitting device. Moreover, since the first electrode layer and the second electrode layer are subsequently covered with an inorganic protective layer (for example, SiNx or SiON), the product performance may be ensured.

In the above-described solution of the present disclosure, the film layer structure of the reflective anode is adjusted, the etching process is adjusted, and a protruding tip is formed in the connection structure. The protruding tip can cut off the evaporated light-emitting material, and then the material of the first electrode layer may be deposited so as to be connected to the second electrode layer, thereby alleviating the IR drop problem and further improving the product performance and the display quality.

Hereto, various embodiments of the present disclosure have been described in detail. Some details well known in the art are not described in order to avoid obscuring the concept of the present disclosure. According to the above description, those skilled in the art would adequately understand how to implement the technical solutions disclosed here.

Although some specific embodiments of the present disclosure have been described in detail by way of examples, those skilled in the art should understand that the above examples are only for the purpose of illustration but not for limiting the scope of the present disclosure. It should be understood by those skilled in the art that modifications to the above embodiments or equivalently substitution of part of the technical features may be made without departing from the scope and spirit of the present disclosure. The scope of the present disclosure is defined by the appended claims.

What is claimed is:

1. A display substrate, comprising:
   a substrate structure comprising a base substrate; and
   a light-emitting structure, a pixel defining layer and a connection structure which are on a side of the base substrate, wherein at least a portion of the light-emitting structure is in an opening of the pixel defining layer, and the connection structure is on a side of the pixel defining layer away from the opening, wherein:
   the light-emitting structure comprises:
      a conductive structure layer on a side of the base substrate;
      a first light-emitting layer on a side of the conductive structure layer away from the base substrate; and
      a first electrode layer on a side of the first light-emitting layer away from the base substrate, wherein a portion of the first electrode layer and a portion of the first light-emitting layer are on a side surface of the pixel defining layer, the side surface of the pixel defining layer being between the opening and the connection structure and close to the connection structure, and the first electrode layer is electrically connected to the connection structure; and
   the connection structure comprises:
      a first conductive layer on a side of the base substrate;
      a second conductive layer on a side of the first conductive layer away from the base substrate; and
      a top structure on a side of the second conductive layer away from the base substrate, wherein an orthographic projection of the second conductive layer on the base substrate is inside an orthographic projection of the top structure on the base substrate, and the top structure comprises a second light-emitting layer;
      wherein an orthographic projection of the first light-emitting layer on the base substrate partially overlaps with an orthographic projection of the second light-emitting layer on the base substrate.

2. The display substrate according to claim 1, wherein:
   the top structure is spaced apart from the pixel defining layer by a gap, and the second conductive layer is spaced apart from the pixel defining layer by the gap;
   the first light-emitting layer comprises an extension portion extending into the gap from the side surface of the pixel defining layer, the extension portion comprising a first extension portion and a second extension portion connected to the first extension portion, wherein the second extension portion is on a side of the first extension portion away from the pixel defining layer,
   wherein a distance between the second extension portion and the second conductive layer is less than a thickness of the first light-emitting layer along a direction perpendicular to the base substrate.

3. The display substrate according to claim 2, wherein:
   the first extension portion has a first slope angle, the first slope angle being an angle between a first slope surface of the first extension portion and a bottom surface of the first extension portion;
   the second extension portion has a second slope angle, the second slope angle being an angle between a second slope surface of the second extension portion and a bottom surface of the second extension portion;
   wherein the first slope angle is different from the second slope angle.

4. The display substrate according to claim 3, wherein the first slope angle is greater than the second slope angle.

5. The display substrate according to claim 3, wherein the top structure further comprises:
   a third conductive layer between the second conductive layer and the second light-emitting layer; and
   a fourth conductive layer on a side of the second light-emitting layer away from the base substrate;
   wherein the second light-emitting layer has a third slope angle, the third slope angle being an angle between a side surface of the second light-emitting layer and a bottom surface of the second light-emitting layer.

6. The display substrate according to claim 5, wherein;
   the first slope angle is less than the third slope angle; and/or
   the second slope angle is less than the third slope angle.

7. The display substrate according to claim 5, wherein the second conductive layer has a fourth slope angle, the fourth slope angle being an angle between a side surface of the second conductive layer and a bottom surface of the second conductive layer.

8. The display substrate according to claim 7, wherein the fourth slope angle is less than the third slope angle.

9. The display substrate according to claim 7, wherein the first slope angle is less than the fourth slope angle, and the second slope angle is less than the fourth slope angle.

10. The display substrate according to claim 5, wherein the conductive structure layer comprises:
    a fifth conductive layer on a side of the base substrate, wherein the fifth conductive layer is in a same layer as the first conductive layer, the fifth conductive layer is isolated from the first conductive layer, and a material of the fifth conductive layer is the same as a material of the first conductive layer;
    a third electrode layer on a side of the fifth conductive layer away from the base substrate, wherein the third electrode layer is in a same layer as the second conductive layer, the third electrode layer is isolated from the second conductive layer, and a material of the third electrode layer is the same as a material of the second conductive layer;
    a sixth conductive layer on a side of the third electrode layer away from the base substrate, wherein the sixth conductive layer is in a same layer as the third conductive layer, the sixth conductive layer is isolated from the third conductive layer, and a material of the sixth conductive layer is the same as a material of the third conductive layer.

11. The display substrate according to claim 5, wherein the second light-emitting layer is in a same layer as the first light-emitting layer, and a material of the second light-emitting layer is the same as a material of the first light-emitting layer.

12. The display substrate according to claim 2, wherein the distance is greater than a length of a bottom surface of the first extension portion along a direction from the side surface of the pixel defining layer to the gap.

13. The display substrate according to claim 2, wherein the thickness of the first light-emitting layer is less than a length of a bottom surface of the second extension portion along a direction from the side surface of the pixel defining layer to the gap.

14. The display substrate according to claim 2, wherein;
    orthographic projection of the first extension portion on the base substrate does not overlap with the orthographic projection of the second light-emitting layer on the base substrate; and/or an orthographic projection of the second extension on the base substrate is inside the orthographic projection of the top structure on the base substrate.

15. The display substrate according to claim 1, wherein the substrate structure further comprises:
   a second electrode layer on a side of the base substrate, wherein the second electrode layer is electrically connected to the first conductive layer; and
   a first insulating layer covering the second electrode layer, wherein the light-emitting structure, the pixel defining layer and the connection structure are on a side of the first insulating layer away from the base substrate.

16. The display substrate according to claim 15, wherein the substrate structure further comprises:
   a buffer layer between the base substrate and the second electrode layer;
   an active layer on a side of the buffer layer away from the base substrate;
   a second insulating layer on a side of the active layer away from the base substrate;
   a gate on a side of the second insulating layer away from the base substrate;
   an interlayer dielectric layer on the side of the buffer layer away from the base substrate, wherein the interlayer dielectric layer covers the active layer, the second insulating layer and the gate; and
   a fourth electrode layer and a fifth electrode layer which are on a side of the interlayer dielectric layer away from the base substrate, wherein the fourth electrode layer is electrically connected to the active layer through a first conductive via hole, the fifth electrode layer is electrically connected to the active layer through a second conductive via hole, the first conductive via hole and the second conductive via hole each passing through the interlayer dielectric layer, and the fourth electrode layer and the fifth electrode layer are in a same layer as the second electrode layer.

17. The display substrate according to claim 16, wherein:
   the first insulating layer comprises: a passivation layer covering the second electrode layer, the fourth electrode layer and the fifth electrode layer, and a planarization layer on a side of the passivation layer away from the base substrate;
   the first conductive layer is electrically connected to the second electrode layer through a third conductive via hole, the third conductive via hole passing through the passivation layer and the planarization layer; and
   the conductive structure layer is electrically connected to the fourth electrode layer or the fifth electrode layer through a fourth conductive via hole, the fourth conductive via hole passing through the passivation layer and the planarization layer.

18. A display device, comprising: the display substrate according to claim 1.

19. A manufacturing method for a display substrate, comprising:
   providing a substrate structure, wherein the substrate structure comprises a base substrate; and
   forming a light-emitting structure, a pixel defining layer and a connection structure on a side of the base substrate, wherein at least a portion of the light-emitting structure is in an opening of the pixel defining layer, and the connection structure is on a side of the pixel defining layer away from the opening, wherein:
   the light-emitting structure comprises: a conductive structure layer on a side of the base substrate, a first light-emitting layer on a side of the conductive structure layer away from the base substrate, and a first electrode layer on a side of the first light-emitting layer away from the base substrate, wherein a portion of the first electrode layer and a portion of the first light-emitting layer are on a side surface of the pixel defining layer, the side surface of the pixel defining layer being between the opening and the connection structure and close to the connection structure, and the first electrode layer is electrically connected to the connection structure; and
   the connection structure comprises: a first conductive layer on a side of the base substrate, a second conductive layer on a side of the first conductive layer away from the base substrate, and a top structure on a side of the second conductive layer away from the base substrate, wherein an orthographic projection of the second conductive layer on the base substrate is inside an orthographic projection of the top structure on the base substrate, and the top structure comprises a second light-emitting layer, wherein an orthographic projection of the first light-emitting layer on the base substrate partially overlaps with an orthographic projection of the second light-emitting layer on the base substrate.

20. The manufacturing method according to claim 19, wherein the first light-emitting layer is formed by an evaporation process, and the first electrode layer is formed by a sputtering process.

* * * * *

UNITED STATES PATENT AND TRADEMARK OFFICE
CERTIFICATE OF CORRECTION

Page 1 of 1

PATENT NO. : 12,464,917 B2
APPLICATION NO. : 18/023447
DATED : November 4, 2025
INVENTOR(S) : Ning Liu et al.

It is certified that error appears in the above-identified patent and that said Letters Patent is hereby corrected as shown below:

In the Claims

Column 19, Line 1, Claim 14, delete "extension" and insert -- extension portion --

Signed and Sealed this
Twenty-third Day of December, 2025

John A. Squires
*Director of the United States Patent and Trademark Office*